US006855009B2

(12) United States Patent
Nishiyama

(10) Patent No.: US 6,855,009 B2
(45) Date of Patent: Feb. 15, 2005

(54) CARD-EDGE CONNECTOR CONTAINING LATCH MECHANISM

(75) Inventor: Yoshiaki Nishiyama, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 13 days.

(21) Appl. No.: 10/400,678

(22) Filed: Mar. 28, 2003

(65) Prior Publication Data

US 2003/0186590 A1 Oct. 2, 2003

(30) Foreign Application Priority Data

Apr. 1, 2002 (JP) ....................................... 2002-098965

(51) Int. Cl.[7] ........................ H01R 24/00; H01R 13/62; H01R 12/00; H05K 1/00

(52) U.S. Cl. .......................... 439/637; 439/325; 439/65

(58) Field of Search ................................ 439/325, 637, 439/345, 62, 65, 636, 157

(56) References Cited

U.S. PATENT DOCUMENTS

| | | | | |
|---|---|---|---|---|
| 4,189,200 A | * | 2/1980 | Yeager et al. | 439/267 |
| 5,709,573 A | * | 1/1998 | McClure | 439/857 |
| 6,123,558 A | | 9/2000 | Shibata | |
| 6,210,209 B1 | * | 4/2001 | Wu et al. | 439/495 |

* cited by examiner

*Primary Examiner*—Chandrika Prasad
(74) *Attorney, Agent, or Firm*—Finnegan, Henderson, Farabow, Garrett & Dunner, LLP

(57) ABSTRACT

When the memory board is not mounted onto the contact terminal group in the body section, the upper portion of the connecting section in the contact terminals located in a midportion of the contact terminal group abut, respectively, to the upper periphery of the gap-adjustment wall section at a predetermined pressure, and the upper portions of the connecting sections of the contact terminals located at the opposite ends of the contact terminal group abut, respectively, to the outer periphery of the adjustment end sections of the hook members.

11 Claims, 20 Drawing Sheets

CARD-EDGE CONNECTOR CONTAINING LATCH MECHANISM

This application claims priority from Japanese Patent Application No. 2002-098965 filed Apr. 1, 2002, which is incorporated hereinto by reference.

BACKGROUND OF THE INVENTION

1. Field of the Invention

The present invention relates to a card-edge connector capable of restricting a gap of a predetermined value between every pair of contact portions in a group of contact terminals.

2. Description of the Related Art

In general, an edge board mounted to an electronic equipment has a terminal group (electrode group) at one end thereof on single-sided or doubled-sided surfaces and is electrically connected a mother board or others, for example, via a card-edge connector. Such a card-edge connector is disclosed, for example, in U.S. Pat. No. 6,123,558, which comprises a base section having a slot for the attachment/detachment of the terminal group of the edge board, a contact terminal group formed in an inner surface of the slot for electrically establishing connection with the terminal group of the edge board, and a latch mechanism for holding the edge board mounted to the slot and selectively pressing one end of the edge board in the detachment direction so that the edge board is apart from the contact terminal group.

The latch mechanism includes a pair of hook members for moving one end of the edge board in the attachment/detachment direction. Each of the hook members is provided for rotation at the both end of the slot in the base section, respectively and has a nib portion entering the slot and engageable with at the edge of one end of the edge board.

Thus, when the respective hook members are made to rotate in the directions opposite to each other, one end of the mounted edge board is pushed by the nib portion in the direction detachable from the contact terminal group. At that time, the respective hook member is made to move rotationally against the elastic force of the contact terminal group nipping one end of the edge board at a predetermined pressure.

Also, gap-adjustment partition walls are provided within the slot, for properly maintaining the gap between the respective contact portions of the contact terminal group for the purpose of obtaining a suitable pressure for holding one end of the edge board in the contact terminal group as well as facilitating the attachment/detachment operation of the edge board relative to the card-edge connector. As disclosed, for example, also in U.S. Pat. No. 4,189,200, the gap-adjustment partition walls are provided so that a predetermined gap is created between every pair of contact portions of the contact terminal group when the edge board is not inserted into the slot. Accordingly, the gap-adjustment partition walls restrict the elastic displacement of all the contact terminal group so that the contact portions of the contact terminal group in the base section are not closer to or more apart from each other than a predetermined distance.

The above-mentioned edge board tends to be smaller in size because of the miniaturization of the electronic equipment on which the former is to be mounted. In such a case, it is required that the downsized edge board is also attachable and detachable without changing a dimension of the base section in the card-edge connector and an arrangement length of the contact terminal group in the slot.

However, for prolonging a dimension of the nib portion of the respective hook member to be inserted into the slot as a width of the edge board becomes narrower as well as selectively inserting the nib portion into the slot, it is necessary to cut out opposite ends of the gap-adjustment partition wall. Thus, there might be a risk in that a gap between the contact portions of the contact terminal group corresponding to a clipped portion in the gap-adjustment partition walls becomes improper.

SUMMARY OF THE INVENTION

In view of the above-mentioned problems, an object of the present invention to provide a card-edge connector capable of restricting a gap between every pair of contact sections in the contact terminal group to a predetermined value, which properly sets a gap between the contacts of the contact terminals without largely changing the design of a base section even in the edge board smaller in size.

To achieve the above object, a card-edge connector according to the present invention comprises a contact terminal group for electrically connecting an electrode group provided at one end of an edge board to an input/output substrate by selectively nipping the electrode group with a pair of contact sections, a base section disposed in the input/output substrate, for supporting the contact terminal group and guidingly supporting the outer periphery of the edge board in an attachable and detachable manner, a gap-adjustment wall section provided between a pair of contact sections in the contact terminal group of the base section, for restricting a gap between the contact sections to a predetermined value, and a latch mechanism disposed in the vicinity of each opposite end of the gap-adjustment wall section in the base section, for pressing one end of the edge board nipped by the contact terminal group in the attachment/detachment direction of the edge board to move the electrode group in the edge board to the contact terminal group, wherein the latch mechanism comprises hook members supported rotational movably by the base section, having a gap-adjustment portion for restricting a gap between the contact sections in the contact terminal group away from the end of the gap-adjustment wall section to a predetermined value and pressing one end of the edge board.

An accommodating space formed on each of opposite sides of the base section in a direction orthogonal to the arrangement direction of the contact terminal group in the gap-adjustment wall section of the base section for accommodating the respective contact terminal group may be partitioned by a plurality barrier walls for connecting the gap-adjustment wall section to the outer periphery of the base section.

The contact terminal group may be disposed so that one of the contact terminal on opposite sides of the gap-adjustment wall section is located between adjacent two contact terminals on the other side. Also, the adjacent contact terminals in the respective accommodation space may be sectioned by a barrier wall formed in the gap-adjustment wall section.

Further, the edge board may be a memory board.

As apparent from the above description, according to the card-edge connector of the present invention, together with the gap-adjustment wall section for restricting the gap between a pair of contact sections in the contact terminal group in the base section at a predetermined value, the latch mechanism provided in the vicinity of each of the opposite ends of the gap-adjustment wall section in the base section is supported on the base section in a rotatable manner to restrict the gap between the contact sections at a predetermined value, and includes a hook member having the gap-adjustment section for pressing one end of the edge board, whereby it is possible to properly set the gap between the contact sections of the contact terminals without changing the design thereof to a great extent even though the edge board becomes smaller in size.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 2:
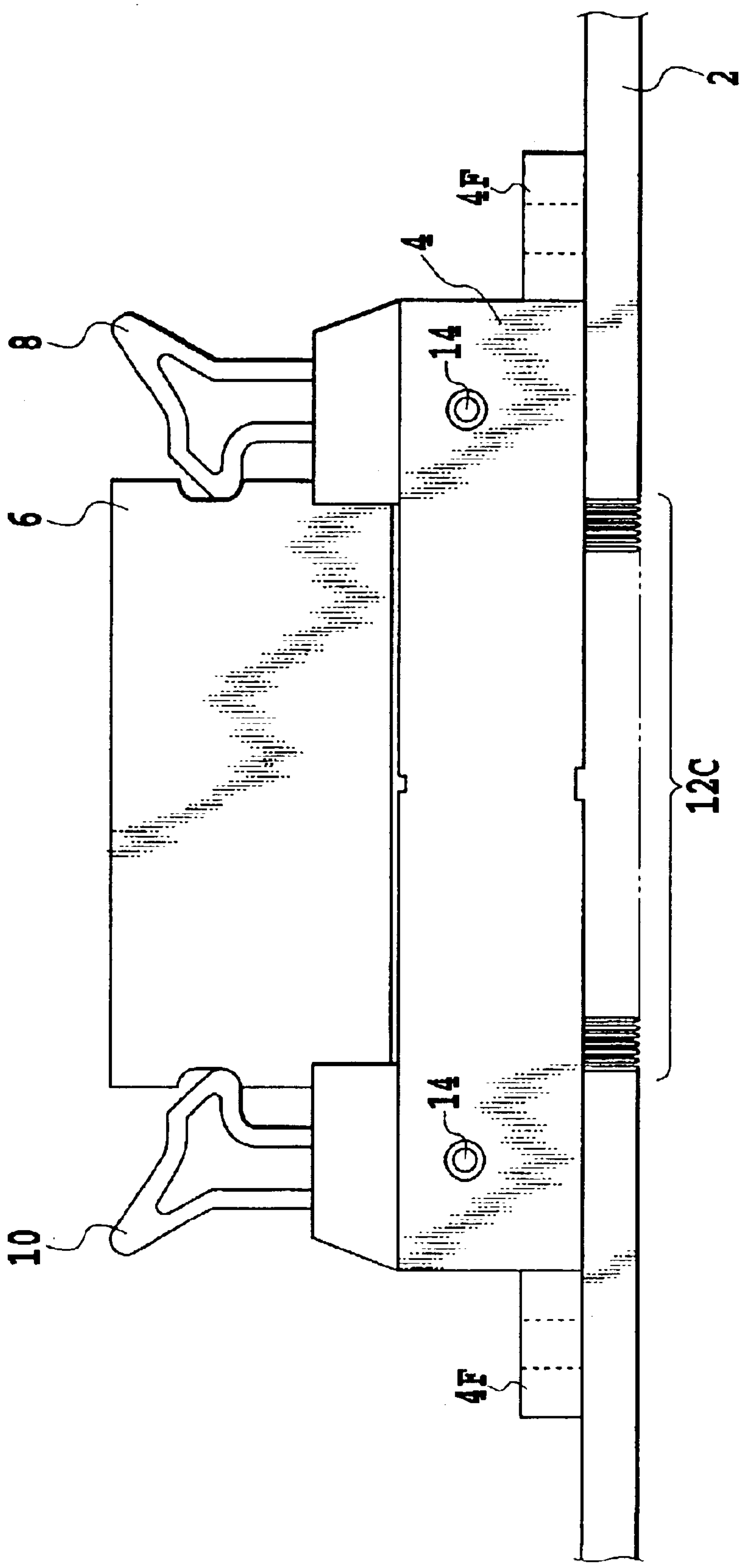
FIG. 2 is a front view showing an appearance of one embodiment of a card-edge connector according to the present invention, illustrated together with a memory board.
Figure 3:
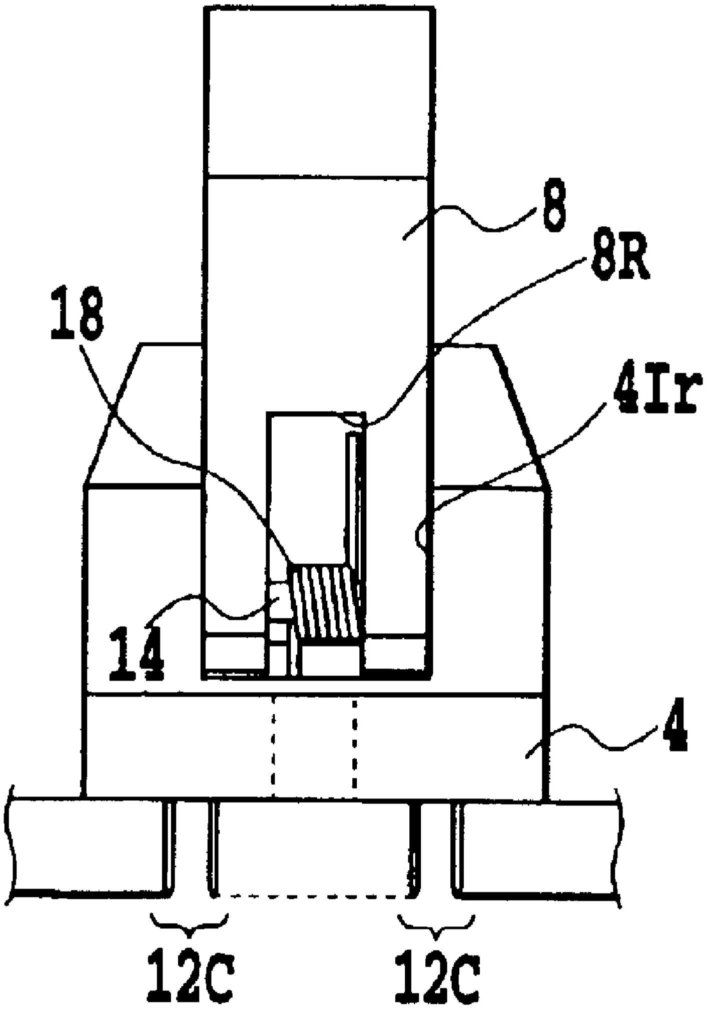
FIG. 3 is a side view of the embodiment shown in FIG. 2.

FIGS. 2 and 3 illustrate an appearance of one embodiment of a card-edge connector according to the present invention, together with a memory board and a wiring board to be electrically connected thereto.

In FIGS. 2 and 3, the card-edge connector is, for example, a memory-socket to be fixed to a mother board 2 incorporated in the interior of an electronic equipment or others.

The card-edge connector is comprised of a body section 4 for accommodating a memory board 6 as an edge board, and hook members 8 and 10 constituting part of a latch mechanism for selectively holding the memory board 6.

Figure 11A:
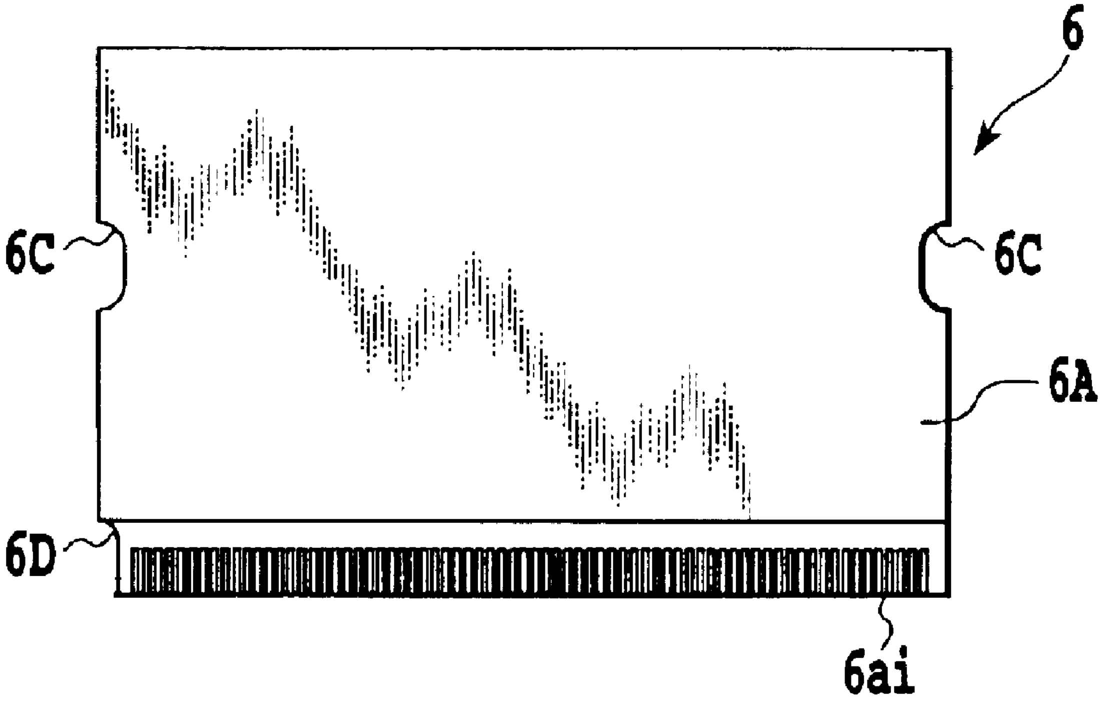
FIGS. 11A and 11B are a plan view and a back view, respectively, illustrating an appearance of a memory board to be mounted to one embodiment of a card-edge connector according to the present invention.
Figure 11B:
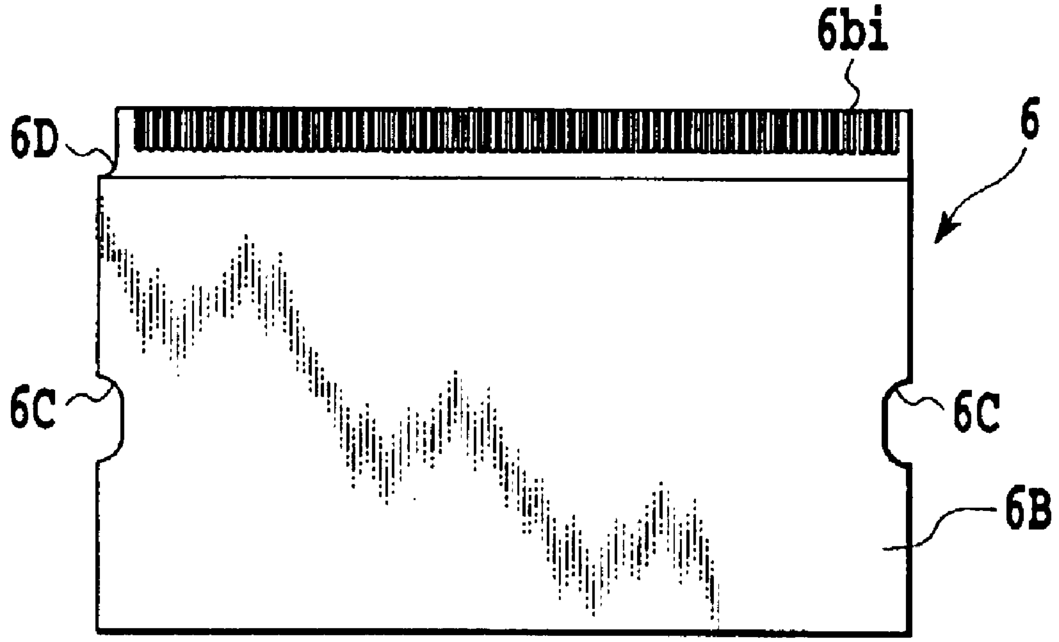
Figure 11C:
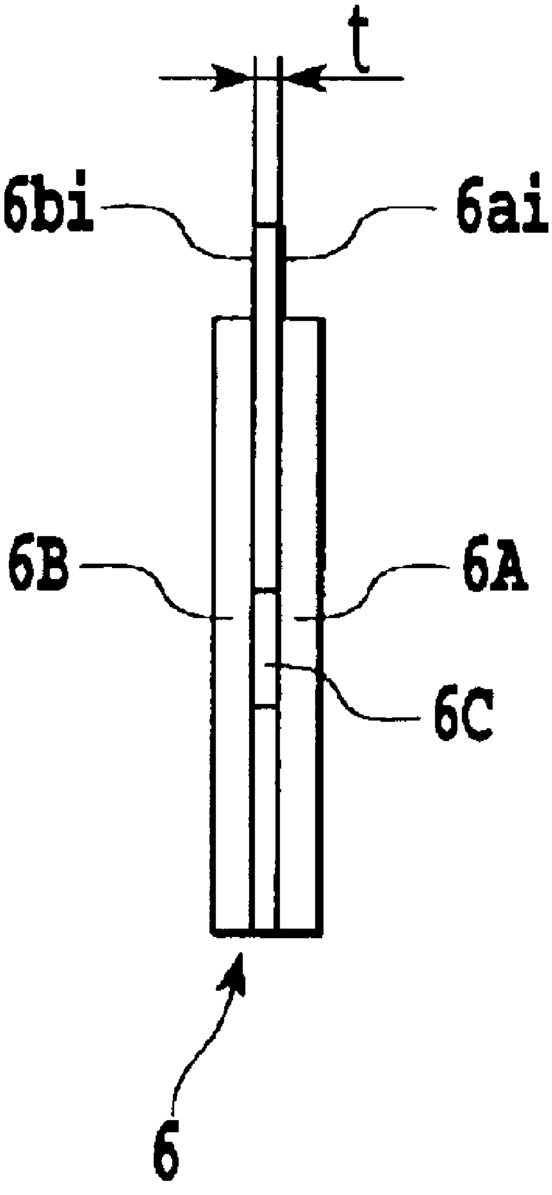
FIG. 11C is a side view of the FIGS. 11A and 11B.

The memory board 6 is a dual inline memory module (DIMM) incorporating a plurality of memory chips therein as shown in FIGS. 11A, 11B and 11C. The memory board 6 has terminal-forming surfaces 6A and 6B opposite to each other. Each of the terminal-forming surfaces 6A and 6B is provided at one end thereof with terminal group 6*ai* and 6*bi*. The terminal groups 6*ai* and 6*bi* have the same number of terminals along the width direction at the same predetermined intervals, respectively. The number of the terminal groups 6*ai* and 6*bi* is, for example, 144, 172 or 200. A thickness t of the one end of the memory board 6 at which the terminal groups 6*ai* and 6*bi* are formed is, for example, approximately 0.8 mm.

On each of the side of the terminal-forming surfaces 6A and 6B, there is a notch 6C to be engageable with a tip end of hook members 8 and 10 described later. Also, on one side of a portion in which the terminal groups 6*ai* and 6*bi* are formed, a chamfer 6D is formed for preventing the memory board 6 from reverse insert.

As shown in FIG. 2, the body section 4 has a pair of flanges 4F at opposite ends of a lower edge thereof for fixing the body section to the mother board 2. The respective flange 4F has a through-hole for inserting an attachment screw through the same. In this regard, while the description is made on the embodiment in which the flange 4F is provided, the present invention should not be limited to such a case but includes a case in which no flange 4F is provided. Of course, even in the latter case, it is needless to say that the effect of the present invention is unchanged.

Figure 4B:
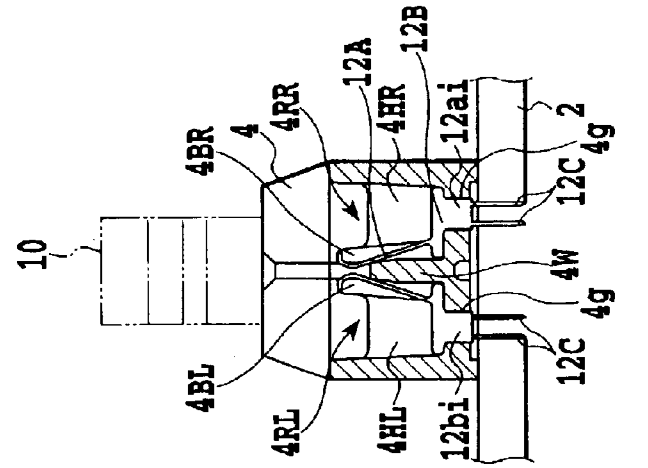
FIG. 4B is a partially sectional view taken along a line IVB—IVB in FIG. 4A.
Figure 4A:
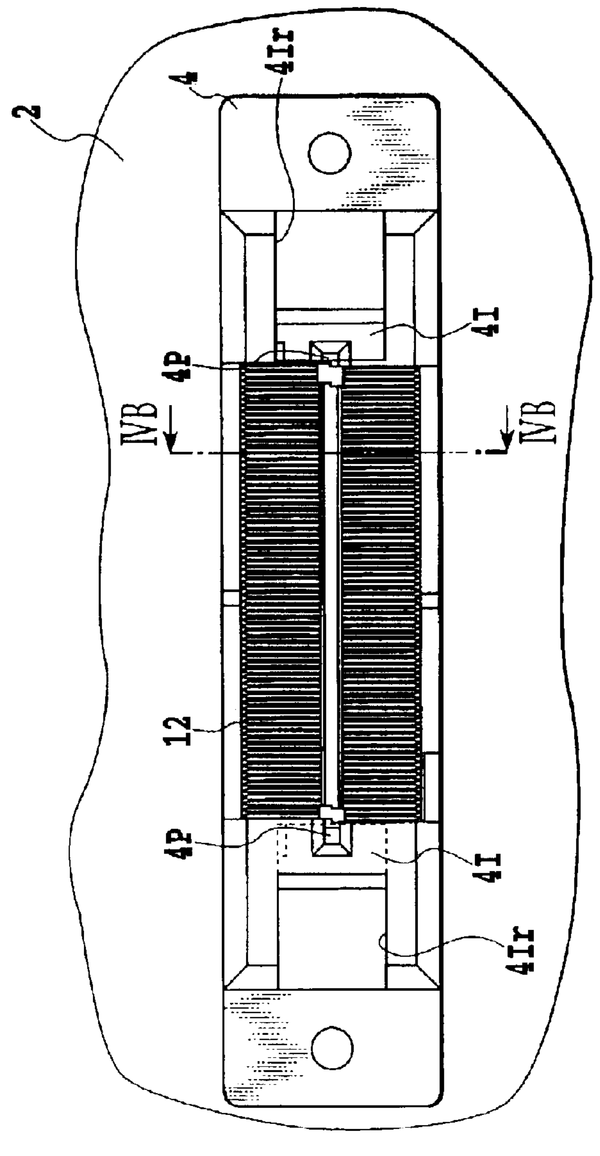
FIG. 4A is a plan view of the embodiment shown in FIG. 2 from which a hook member is removed.

As shown in FIGS. 4A and 4B, there are contact terminal group 12 provided in a central recess of the body section 4, for the electrical connection of an electro-conductive layer of the mother board 2 with the terminal groups 6*ai* and 6*bi* in the memory board 6. As shown in FIG. 4B, the contact terminal group 12 includes a plurality of contact terminals 12*ai* and 12*bi* (i=1 to n, wherein n is a positive integer). The contact terminals 12*ai* and 12*bi* are provided, respectively, in recesses 4RR and 4RL formed in a central portion of the body section 4. Between the recesses 4RR and 4RL are partitioned by a gap-adjustment wall section 4W. Since the structure of the contact terminal 12*ai* is the same as that of the contact terminal 12*bi*, the description will be made solely on the contact terminal 12*ai*, and that on the contact terminal 12*bi* will be eliminated in this text.

As shown in FIG. 4B, the contact terminal 12*ai* includes a proximal end terminal 12C fixed to the mother board 2, a contact section 12A to be electrically connected to the terminal group 6*bi* of the memory board 6, and a connecting section 12B for coupling the proximal end terminal 12C to the contact section 12A.

Figure 5A:
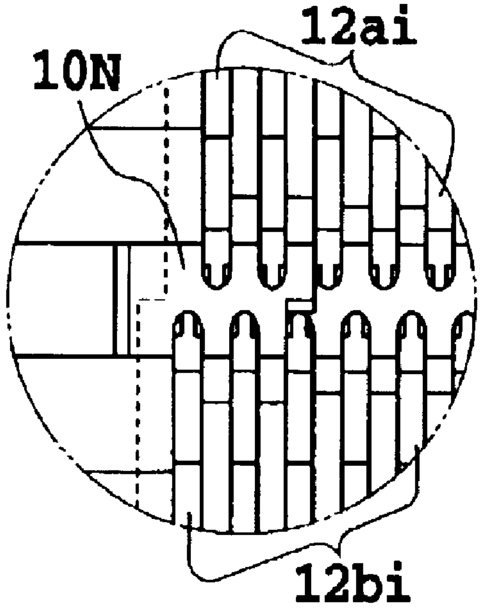
FIG. 5A is a partially enlarged view showing enlargedly one end of the embodiment shown in FIG. 4A.
Figure 5B:
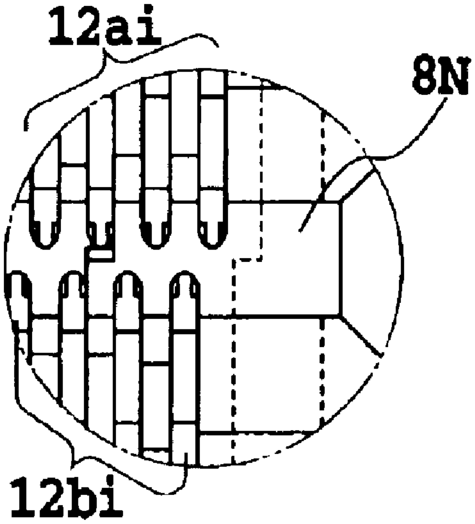
FIG. 5B is a partially enlarged view showing enlargedly the other end of the embodiment shown in FIG. 4A.
Figure 7:
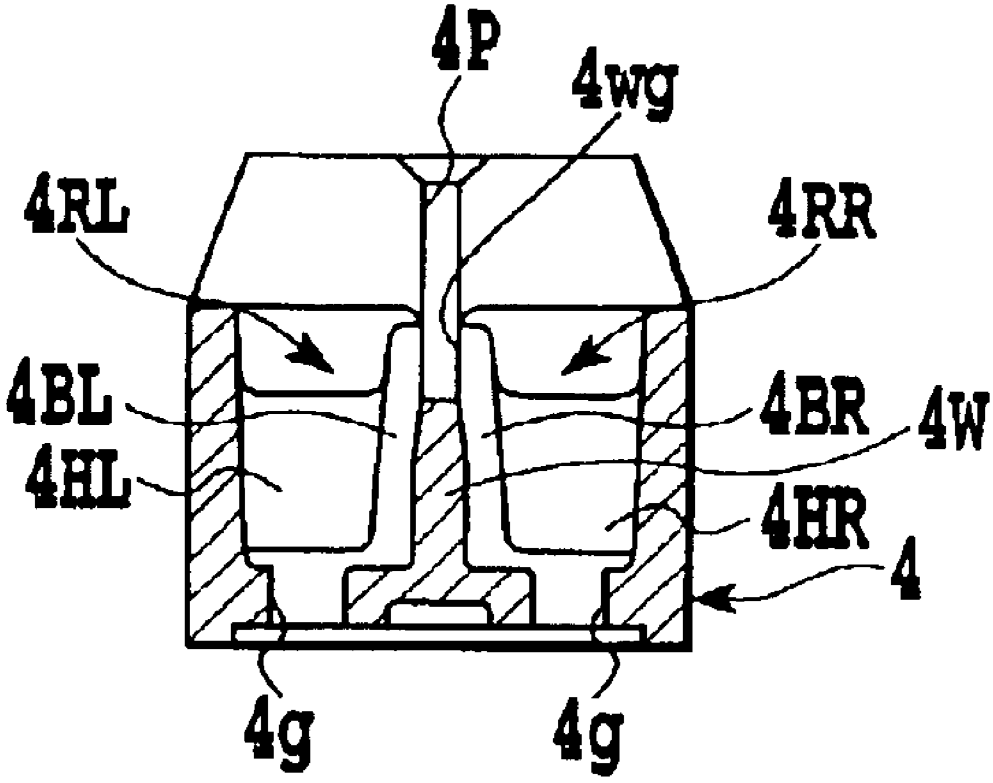
FIG. 7 is a partially cross-sectional view taken along a line VII—VII in the embodiment shown in FIG. 6.

As shown in FIGS. 4B and 7, the connecting section 12B is press-fit into a narrow groove 4*g* formed in the bottom of the recess 4RR. At that time, the connecting section 12B is press-fit into the groove 4*g* so that part of a straight portion of the contact section 12A having a bending tip end is brought into contact with the upper portion of the gap-adjustment wall section 4W. Also, as shown in FIGS. 5A and 5B, one contact terminal 12*ai* is disposed at a position between the adjacent two contact terminals 12*bi*. That is, the contact terminals 12*ai* and 12*bi* are arranged in a so-called staggered manner. At that time, as shown in FIG. 4B, the upper portions of the connecting sections 12B of the contact terminal 12*ai* and 12*bi* touch to the outer periphery of the upper portion of the gap-adjustment wall section 4W at a predetermined pressure.

Figure 8A:
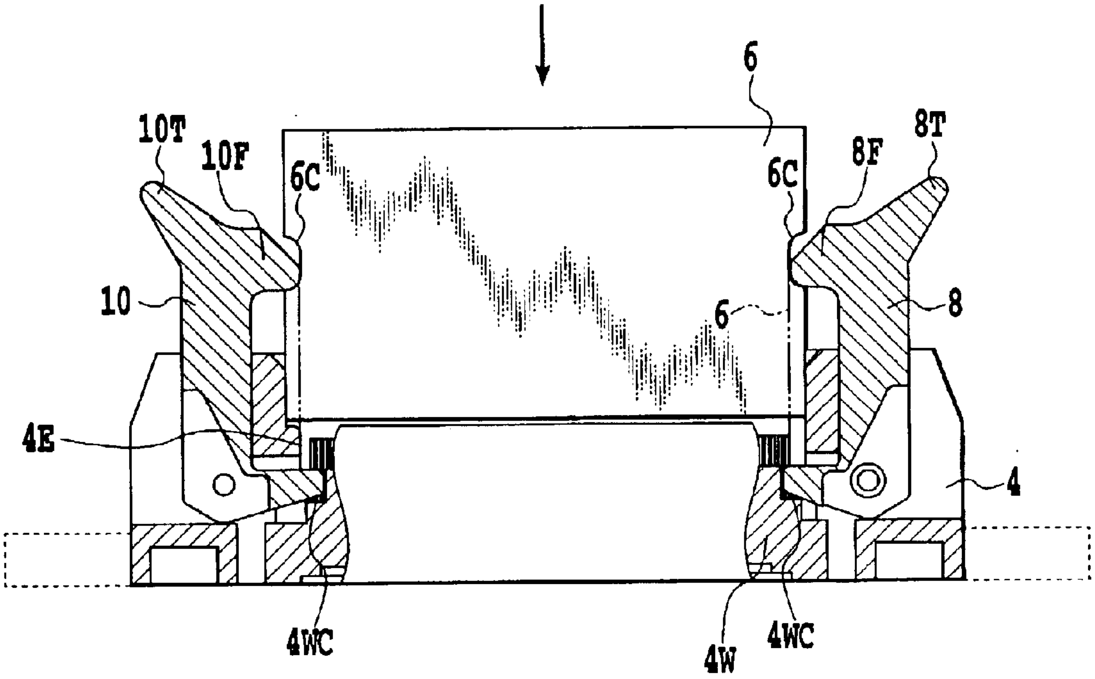
FIGS. 8A and 8B are cross-sectional views, respectively, made available for explaining the operation of the embodiment shown in FIG. 2.
Figure 8B:
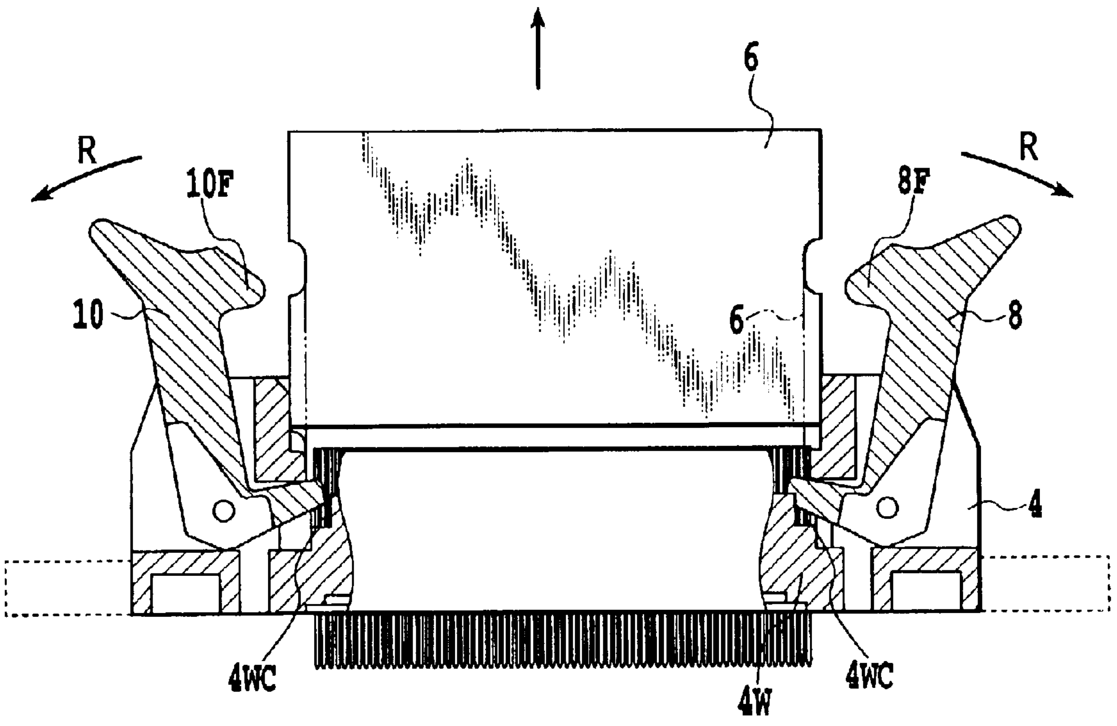

The gap-adjustment wall section 4W extends by a predetermined length along the arrangement directions of the contact terminals 12*ai* and 12*bi*, respectively. In this connection, the opposite ends of the gap-adjustment wall section 4W do not coincide with the extremity ends of the terminal row of the contact terminals 12*ai*, 12*bi*. That is, as shown in FIGS. 8A and 8B, the notch 4*wc* are formed, respectively, at the opposite ends of the gap-adjustment wall section 4W in correspondence to several contact terminals 12*ai* and 12*bi* positioned in the vicinity of the opposite ends of the contact terminal group 12. Within the respective notch 4*wc*, the gap-adjustment section of the hook members 8 and 10 described later is selectively entered.

Figure 6:
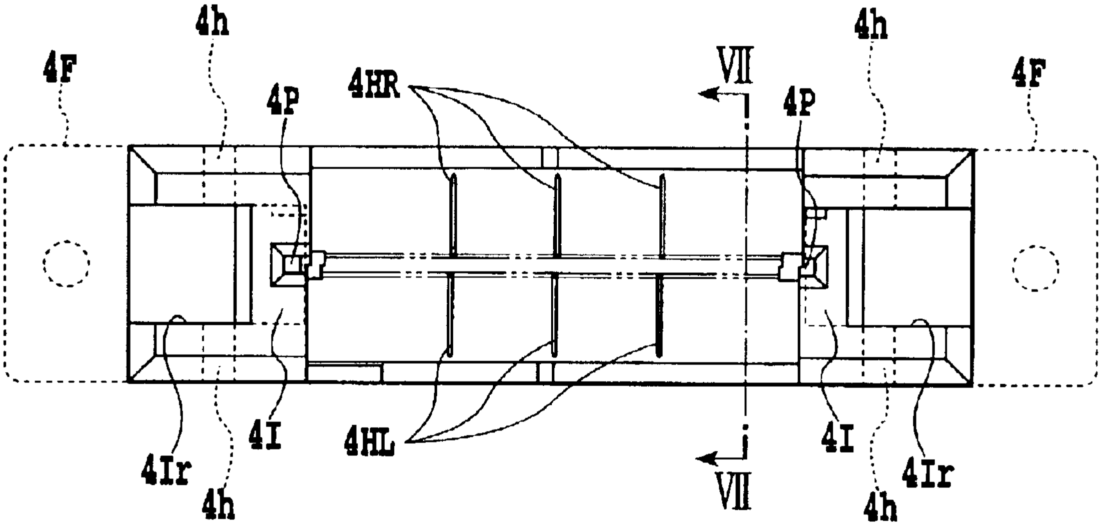
FIG. 6 is a plan view showing the body with the contact terminal removed in the embodiment shown in FIG. 4.

As shown in FIG. 7, in a top of the gap-adjustment wall section 4W, a groove 4*wg* in which the terminal groups 6*bi* and 6*ai* of the memory board 6 are arranged extends in a predetermined depth along the arrangement direction thereof. Also, as shown in FIG. 6, in a guiding section 4I provided at each of the opposite ends of the gap-adjustment wall section 4W, a guiding groove 4P is formed. The guiding groove 4P render locating relatively the terminal groups 6*ai* and 6*bi* of the attached and detached memory board 6 relative to the contact terminals 12*ai* and 12*bi*.

Accordingly, a predetermined gap, for example, of approximately 0.3 mm is formed in an initial state (when no memory board 6 is mounted) between the bending portion of the contact section 12A in the contact terminal 12*ai* and the bending portion of the contact section 12A in the contact terminal 12*bi*.

As shown in FIG. 4B, the proximal end terminal 12C is electrically connected to the mother board 2 by soldering the former to the electro-conductive layer of the mother board 2.

As shown in FIG. 4B, a partition wall 4BR for sectioning the adjacent contact terminals 12*ai* along the direction generally orthogonal to the arrangement direction thereof is provided between the adjacent contact terminals 12*ai*. Also, a partition wall 4BL for sectioning the adjacent contact terminals 12*bi* along the direction generally orthogonal to the arrangement direction thereof is provided between the adjacent contact terminals 12*bi*.

As further shown in FIGS. 6 and 7, three barrier walls 4HR for sectioning a space within the recess 4RR into a plurality of compartments at a predetermined intervals are formed generally in parallel to the partition wall 4BR. In the similar manner, three barrier walls 4HL for sectioning a space within the recess 4RL into a plurality of compartments at a predetermined intervals are formed generally in parallel to the partition wall 4BL.

By providing the barrier walls 4HR and 4HL as reinforcement means in such a manner, the flexural rigidity of the body section 4 itself is enhanced to prevent the deformation or others of the body section 4 due to the heat expansion from occurring.

As shown in FIG. 6, in the respective guiding section 4I described before, a recess 4Ir in which hook members 8 and 10 are disposed is formed to be apart from the guiding groove 4P. In a wall defining the recess 4Ir, a pair of through-holes 4*h* are formed opposite to each other for allowing a pin member 14 to be inserted for supporting the hook members 8 and 10 in a rotatable manner. The opposite ends of the pin member 14 are press-fit into the through-hole 4*h* in a wall of the respective guiding section 4I as shown in FIG. 3.

Figure 13A:
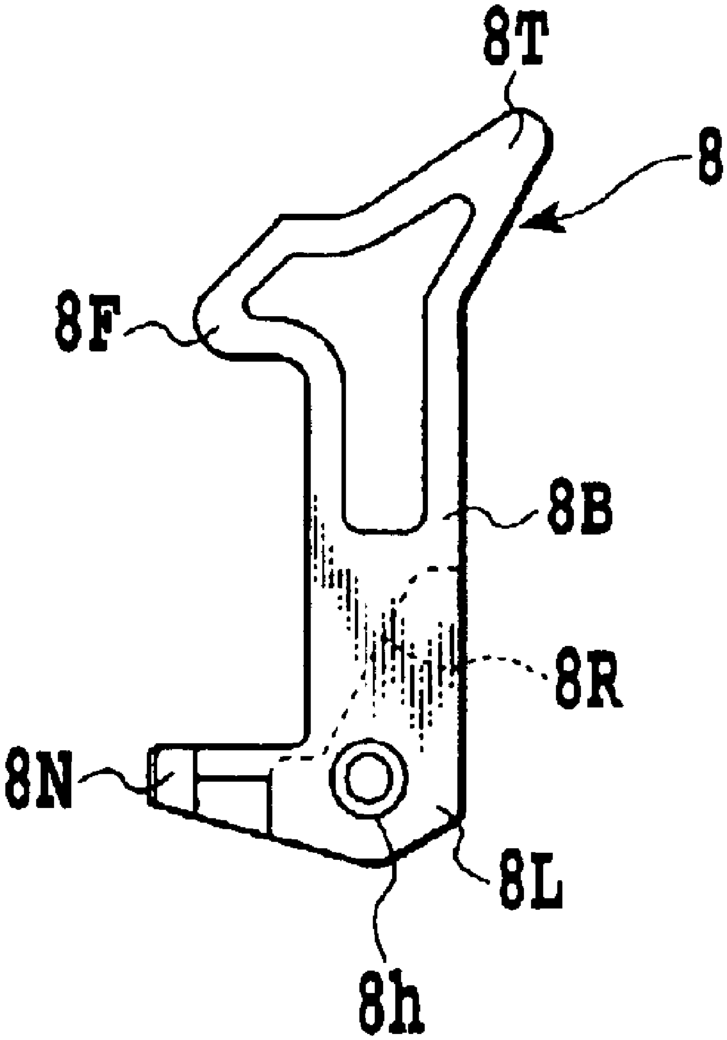
FIG. 13A is a front view showing an appearance of the other of the pair of hook members used in the embodiment of the card-edge connector according to the present invention.
Figure 13B:
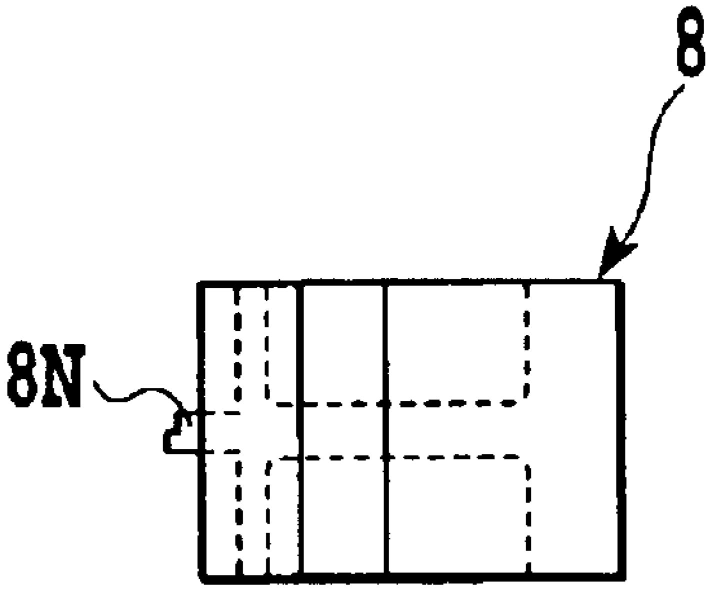
FIG. 13B is a plan view of FIG. 13A.

As shown in FIGS. 13A and 13B, the hook member 8 includes a an operating section 8T actuated, a base section 8L having a through-hole 8*h* for allowing the pin member 14 to be inserted, and a connecting section 8B for coupling the operating section 8T with the base section 8L. In the operating section 8T, a holder section 8F for holding the memory board 6 is formed hook in shape relative to the connecting section 8B, which is selectively engageable with the notch 6C of the memory board 6 as above.

Figure 9A:
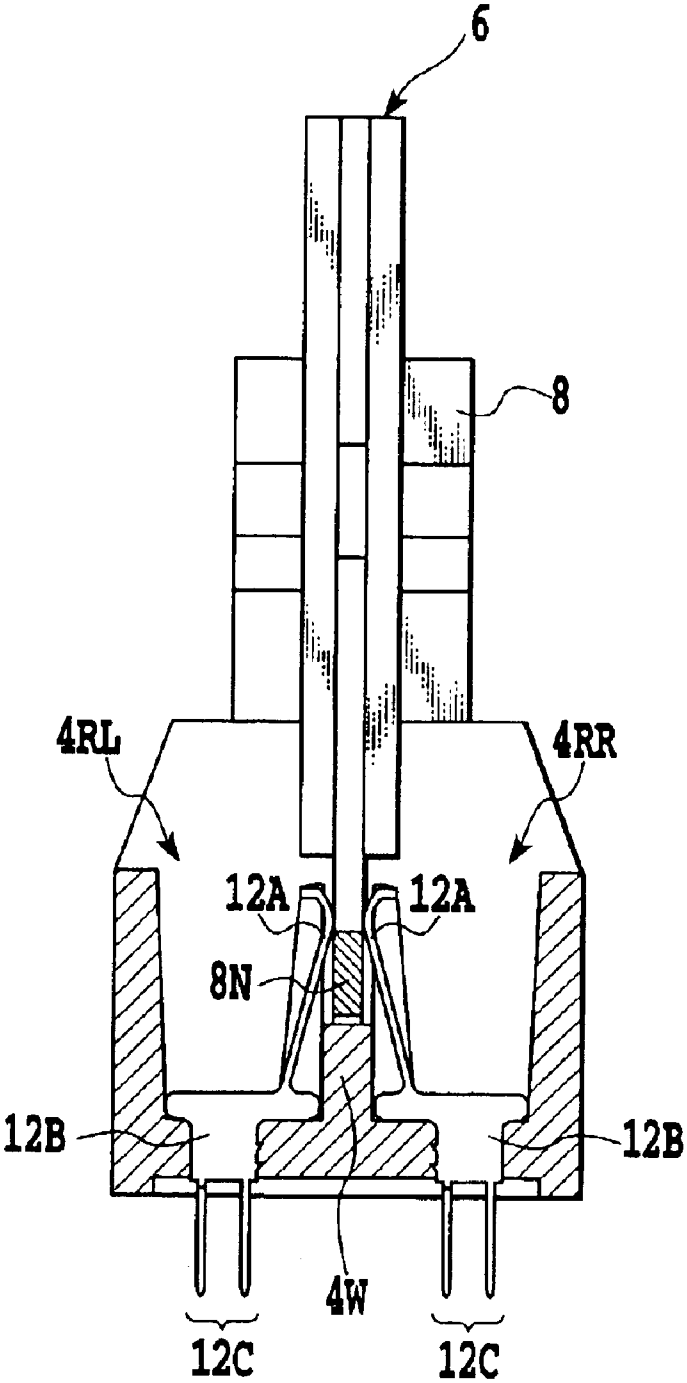
FIG. 9A is a partially sectional view illustrating the embodiment in FIG. 1A in a state wherein a memory board is mounted thereon.
Figure 9B:
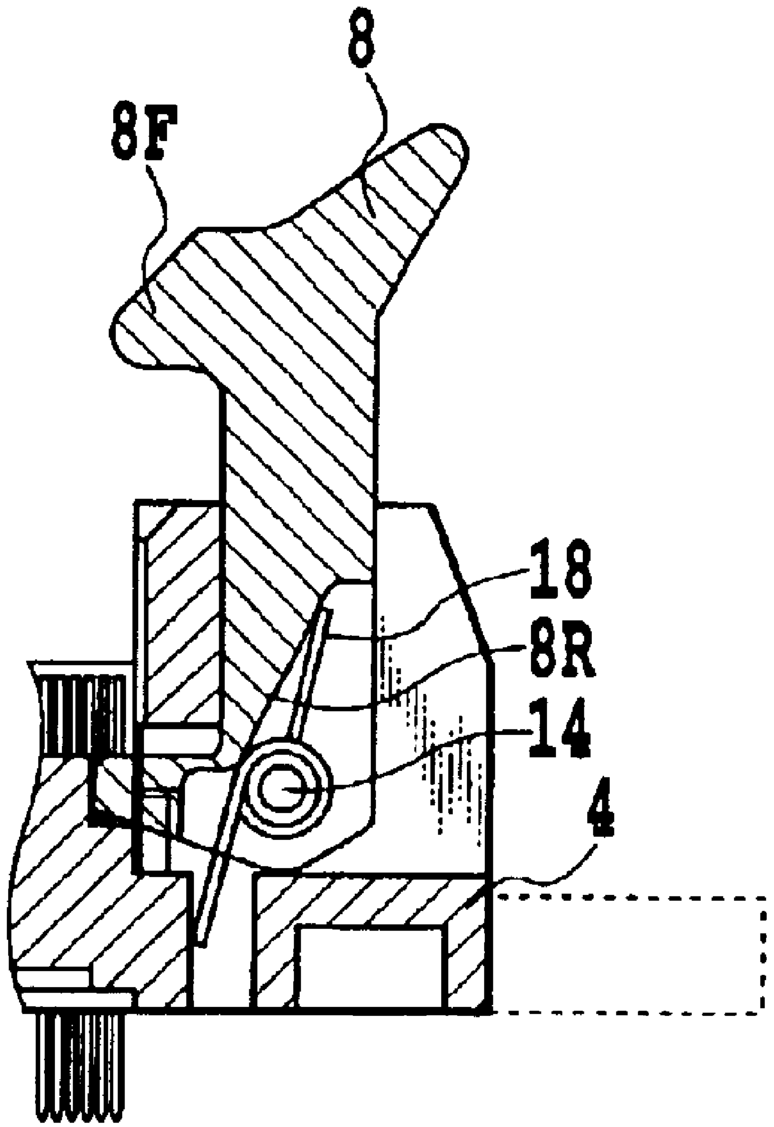
FIG. 9B is a partially sectional view illustrating a part of FIG. 8A in an enlarged state.
Figure 10A:
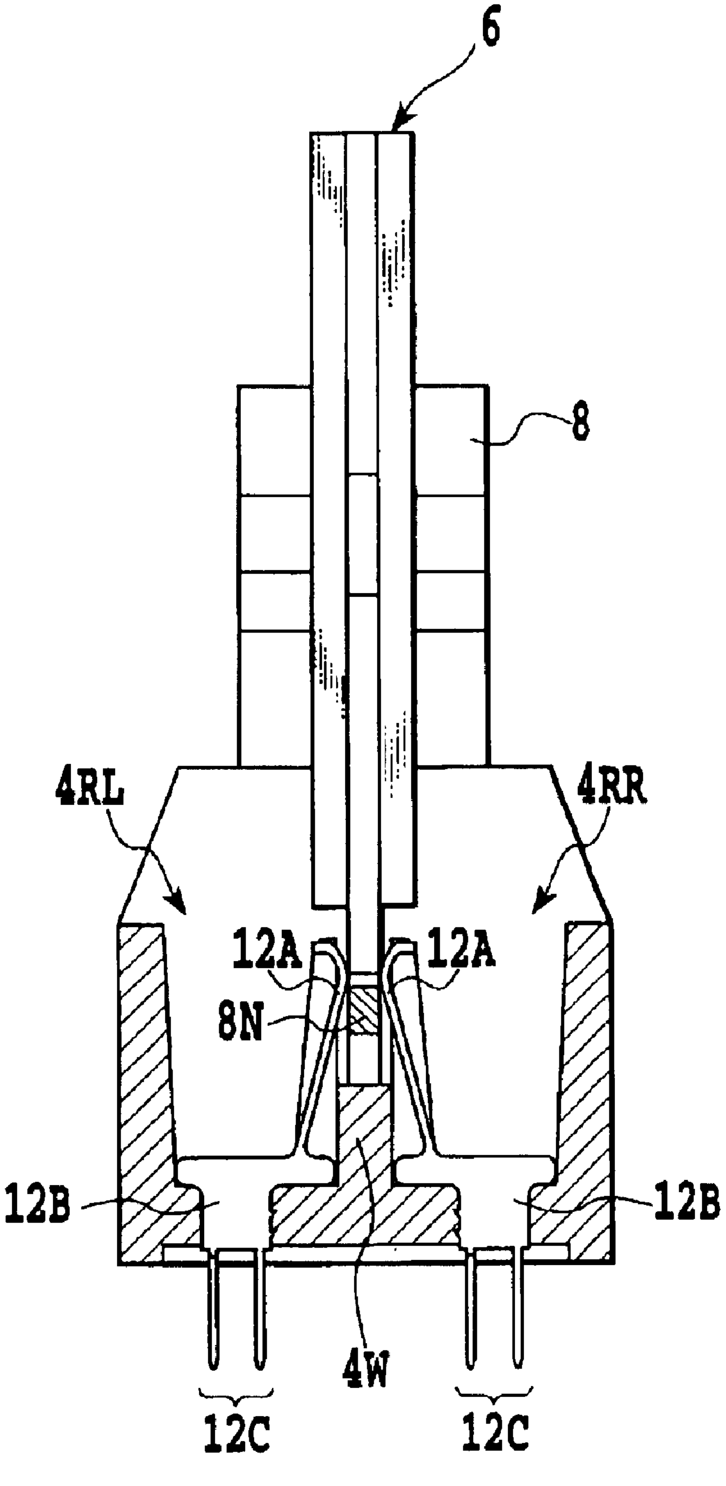
FIG. 10A is a partially sectional view illustrating the embodiment shown in FIG. 1B in a state wherein a memory board is mounted thereon.
Figure 10B:
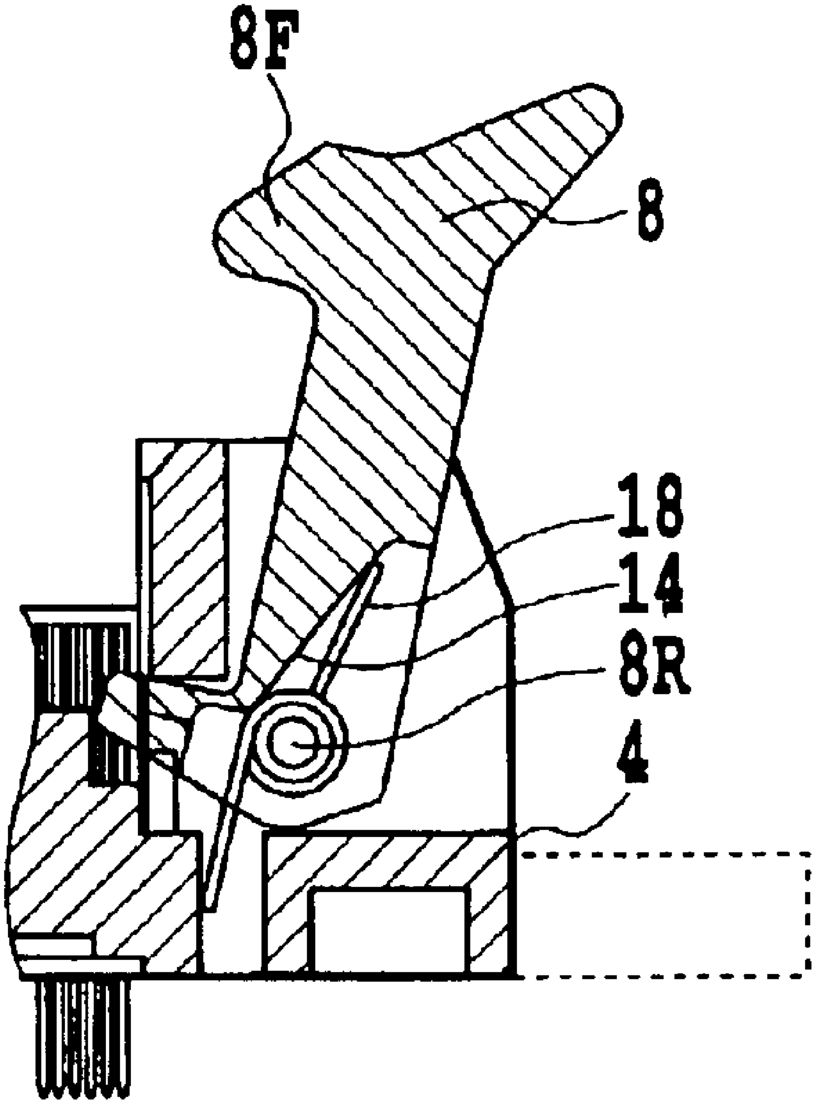
FIG. 10B is a partially sectional view illustrating a part of FIG. 8B in an enlarged state.

As shown in FIG. 9B, in the connecting section 8B, a recess 8R is formed for accommodating a return spring 18 wound around the pin member 14. One end of the return spring 18 touches to a wall surface defining the recess 8R, and the other end of the return spring 18 touches to the lower portion of the body section 4. Thereby, the return spring 18 biases the holder section 8F of the hook member 8 in the direction in which the holder section 8F of the hook member 8 is engaged with the notch 6C of the memory board 6.

As shown in FIGS. 13A and 13B, in a portion of the base section 8L opposed to the above-mentioned holder section 8F, an adjustment end section 8N is provided for adjusting a gap between the contact sections 12A of the contact terminals 12*ai* and 12*bi*. A tip end of the adjustment end section 8N has a step as shown in FIG. 5B in an enlarged manner. A length of the tip end of the adjustment end section 8N is selected so that the respective gap in the contact sections 12A of two pairs of contact terminals 12*ai* and 12*bi* are adjustable. A thickness of the tip end of the adjustment end section 8N is selected to be equal to that of the end of the memory board 6 or somewhat larger than the latter.

Figure 1A:
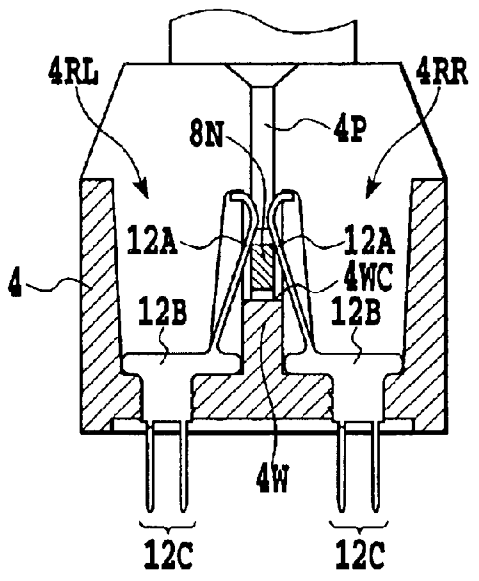
FIG. 1A is a partially sectional view showing a main part of one embodiment of a card-edge connector according to the present invention.
Figure 1B:
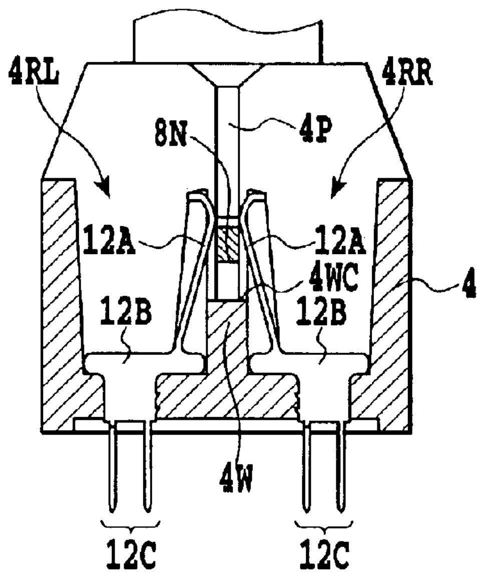
FIG. 1B is another partially sectional view made available for explaining the operation of the same embodiment as shown in FIG. 1A.

Thus, as shown in FIG. 1A, when the hook member 8 is provided in the guiding section 4I so that the adjustment end sections 8N thereof are disposed in a space encircled by the contact sections 12A of the contact terminals 12*ai* and 12*bi*, the respective gap of the contact sections 12A in two pairs of contact terminals 12*ai* and 12*bi* which is located at one end of the terminal array away from the end portion of the gap-adjustment wall section 4W is set to a proper value in the same as the above-mentioned predetermined value. On the other hand, when the hook member 8 is made to move rotationally against the biasing force of the return spring 18 as shown in FIG. 1B, the adjustment end section 8N touches to both the inner surfaces of the contact sections 12A of the contact terminals 12*ai* and 12*bi*, after which the contact sections 12A of the contact terminal sections 12*ai* and 12*bi* are further made to move rotationally so that the contact sections 12A of the contact terminals 12*ai* and 12*bi* are furthermore away from each other.

Figure 12A:
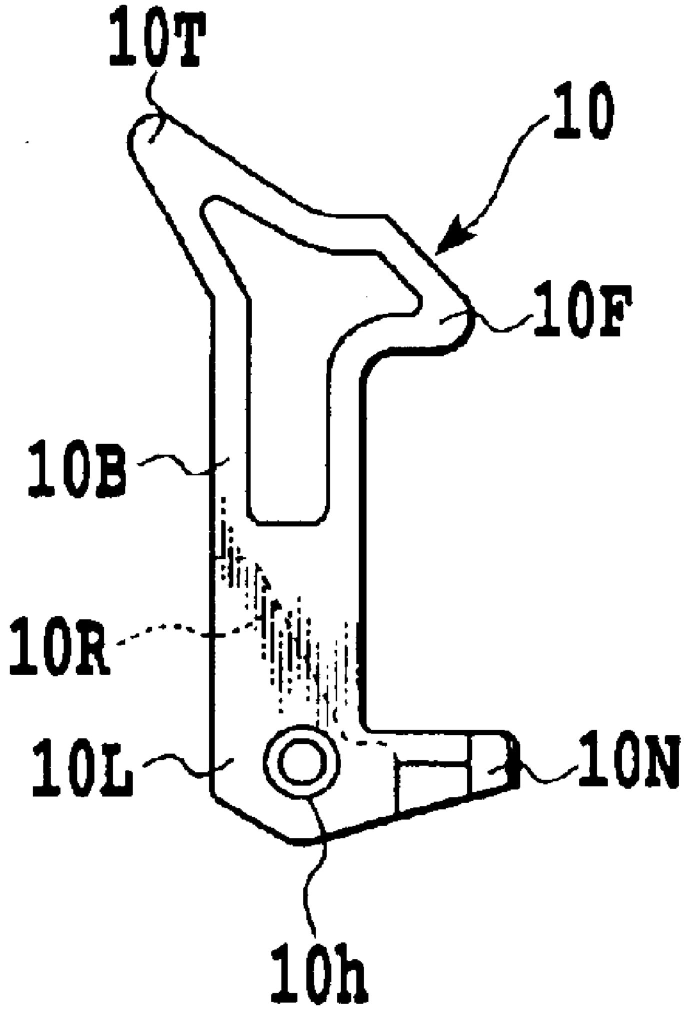
FIG. 12A is a front view showing an appearance of one of a pair of hook members used in one embodiment of a card-edge connector according to the present invention.
Figure 12B:
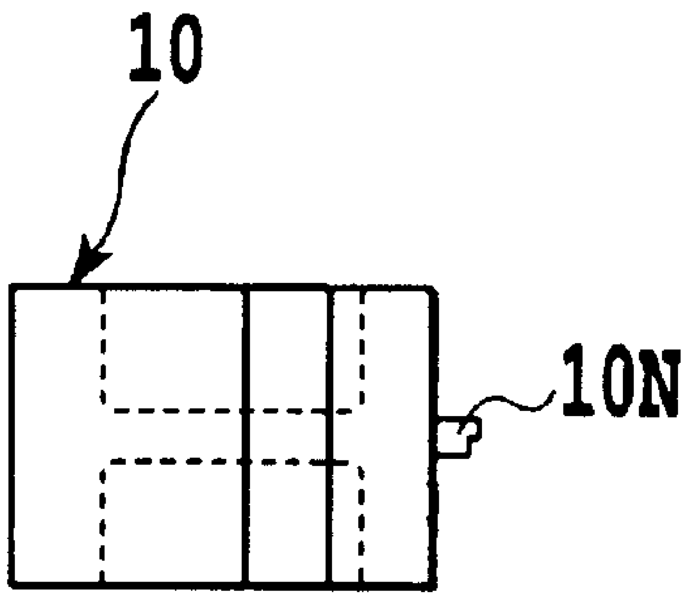
FIG. 12B is a plan view of FIG. 12A.

As shown in FIGS. 12A and 12B, the hook member 10 includes an operating section 10T actuated, a base section 10L having a through-hole 10*h* to be inserted with a pin member 14 and a connecting section 10B for coupling the operating section 10B with the base section 10L. In the operating section 10T, a holder section 10F is formed hook in shape relative to the connecting section 8B. The holder section 10F is selectively engageable with a notch 6C of the above-mentioned memory board 6 to hold the latter.

In the connecting section 10B, a recess 10R is provided for accommodating a return spring 18 wound around the pin member 14. One end of the return spring 18 touches a wall surface defining the recess 10R, and the other end of the return spring 18 touches to the lower portion of the body section 4. Thereby, the return spring 18 biases the hook member 10 so that the holder section 10F thereof is biased in the direction that engages the notch 6C in the memory board 6.

In a portion of the base section 10L opposed to the above-mentioned holder section 10F, as shown in FIGS. 12A and 12B, an adjustment end section 10N is provided for adjusting a gap between the contact sections 12A of the contact terminals 12*ai* and 12*bi*. As shown in FIG. 5A in an enlarged manner, a tip end of the adjustment end section 10N has a step. A length of the tip end of the adjustment end section 10N is selected so that the respective gap in the contact sections 12A of two pairs of contact terminals 12*ai* and 12*bi* are adjustable. Accordingly, in the same manner as in the above-mentioned hook member 8, when the hook member 10 is provided in the guiding section 4I so that the adjustment end section 10N is disposed in a space encircled by the contact sections 12A of the contact terminals 12*ai* and 12*bi*, the respective gap of the contact sections 12A in two pairs of contact terminals 12*ai* and 12*bi* which is located at an end portion of the terminal array away from the end of the gap-adjustment wall section 4W is set at the above-mentioned predetermined value. On the other hand, as shown in FIG. 1B, when the hook member 10 is made to move rotationally against the biasing force of the return spring 18, the adjustment end section 8N touches both the inner surfaces of the contact sections 12A of the contact terminals 12*ai* and 12*bi*, after which the contact sections 12A of the contact terminal sections 12*ai* and 12*bi* are further made to move rotationally so that the contact sections 12A of the contact terminals 12*ai* and 12*bi* are furthermore away from each other.

Accordingly, even if a width of the terminal-forming surfaces 6A and 6B of the memory board 6 becomes somewhat smaller as shown by a chain double-dashed dashed line in FIGS. 8A and 8B whereby the contact sections 12A of several contact terminals 12*ai* and 12*bi* are not usable, it is possible for the adjustment end sections 8N and 10N of the hook members 8 and 10 to be inserted between the contact sections 12A in the contact terminals 12*ai* and 12*bi*.

In such a structure, when memory board 6 is mounted to the body section 4 and the terminal group of the terminal-forming surfaces 6A and 6B of the memory board 6 are electrically connected to the contact portion 12A of the contact terminals 12*ai* and 12*bi*, the memory board 6 is inserted in the direction shown by an arrow in FIG. 8A. First, the operating sections 8T and 10T of the hook members 8 and 10 are once made to move rotationally against the biasing force of the return spring 18 in the direction that separates the both away from each other, and thereafter, the terminal-forming surfaces 6A and 6B of the memory board 6 are inserted into the space between the contact sections 12A in the direction shown by an arrow in FIG. 8A. Thus, as shown in FIGS. 8A, 9A and 9B, a portion of the end section of the terminal-forming surfaces 6A and 6B in the memory board 6 is engaged with the adjustment end sections 8N and 10N of the hook members 8 and 10. At that time, the chamfer 6D of the memory board 6 is engaged with a projection 4E of the body section 4 for preventing the memory board from being inserted in reverse. Also, immediately thereafter, the holder sections 8F and 10F of the hook members 8 and 10 are close to each other and engaged with the notch 6C, whereby the memory board 6 is held onto the body section 4.

On the other hand, when the memory board 6 held onto the body section 4 is removed from the latter, first, the operating sections 8T and 10T are made to move rotationally against the biasing force of the return spring 18 so that the holder sections 8F and 10F of the hook members 8 and 10 are away from the notch 6C in the direction shown by an arrow R in FIG. 8B, and then part of the end-sections of the terminal-forming surfaces 6A and 6B of the memory board 6 is moved by the adjustment end sections 8N and 10N of the hook members 8 and 10 so that the terminal-forming surfaces 6A and 6B are away from the contact sections 12A in the direction shown by an arrow in FIG. 8B.

At that time, a gap between the contact sections 12A of the contact terminals 12*ai* and 12*bi* located in the vicinity of the opposite ends of the contact terminal group 12 are enlarged by the adjustment end sections 8N and 10N, which facilitates the detachment of the memory board 6.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A card-edge connector comprising:

a first contact terminal group configured to connect with a second terminal group provided at one end of a removable board by selectively nipping respective contacts of said second terminal group, said first contact terminal group comprising a plurality of individual first contact terminals arranged in two rows;

a body section disposed on a mother board, for supporting said first contact terminal group and guidingly supporting said removable board in an attachable and detachable manner;

a gap-adjustment wall section provided between said rows of first contact terminals, for forming a gap between interior ones of said first contact terminals; and a latch mechanism disposed in the vicinity of each opposite end of said gap-adjustment wall section in said body section, for holding one end of said removable board with said first contact terminal group engaged with said second terminal group;

wherein said latch mechanism comprises hook members rotatably mounted on said body section, each having an adjustment end section for adjusting a gap between said first contact terminals at the ends of said rows.

2. A card-edge connector as claimed in claim 1, wherein an accommodating space is formed in said body section, said accommodating space accommodating said rows of first contact terminals, and partitioned by a plurality of barrier walls for connecting said gap-adjustment wall section to said body section.

3. A card-edge connector as claimed in claim 2, wherein said first contact terminal group is disposed so that one of said first contact terminals in one of said two rows is located between two adjacent first contact terminals in the other of said two rows.

4. A card-edge connector as claimed in claim 3, wherein said two adjacent first contact terminals are sectioned by one of said plurality of barrier walls.

5. A card-edge connector as claimed in claim 1, wherein said removable board is a memory board.

6. A card-edge connector as claimed in claim 1 wherein said first contact terminal group is fixed to said mother board by soldering.

7. A card-edge connector as claimed in claim 1, wherein said hook members of said latch mechanism are biased by a spring provided in said body section.

8. A card-edge connector as claimed in claim 1, wherein one end of said hook members is formed in the shape of a hook.

9. A card-edge connector as claimed in claim 1, wherein said adjustment end section has a step.

10. A card-edge connector comprising:

a first contact terminal group configured to connect with a second terminal group provided at one end of a removable board by selectively nipping respective contacts of said second terminal group, said first contact terminal group comprising a plurality of individual first contact terminals arranged in two rows;

a body section disposed on a board, for supporting said first contact terminal group and guidingly supporting said removable board in an attachable and detachable manner;

a gap-adjustment wall section provided between said rows of first contact terminals, for forming a gap between interior ones of said first contact terminals; and a latch mechanism disposed in the vicinity of each opposite end of said gap-adjustment wall section in said body section, for holding one end of said removable board with said contact terminal group engaged with said second terminal group;

wherein said latch mechanism comprises hook members which are rotably mounted on said body section and each of which is biased by a spring provided in said body section, each having an adjustment end section for adjusting a gap between said first contact terminals at the ends of said rows, said adjustment end section having a step.

11. A card-edge connector as claimed in claim 1, wherein said gap-adjustment wall section has a notch at either of the opposite ends.

* * * * *

UNITED STATES PATENT AND TRADEMARK OFFICE

CERTIFICATE OF CORRECTION

PATENT NO. : 6,855,099 B2
DATED : February 15, 2005
INVENTOR(S) : Yoshiaki Nishiyama It is certified that error appears in the above-identified patent and that said Letters Patent is hereby corrected as shown below:

Column 10,
Line 10, "rotably" should read -- rotatably --.

Signed and Sealed this

Fourteenth Day of June, 2005

JON W. DUDAS
*Director of the United States Patent and Trademark Office*

UNITED STATES PATENT AND TRADEMARK OFFICE
CERTIFICATE OF CORRECTION

PATENT NO. : 6,855,009 B2
APPLICATION NO. : 10/400678
DATED : February 15, 2005
INVENTOR(S) : Yoshiaki Nishiyama It is certified that error appears in the above-identified patent and that said Letters Patent is hereby corrected as shown below:

Claim 10, column 10, line 10, “rotably” should read --rotatably--.

Signed and Sealed this

Nineteenth Day of February, 2008

JON W. DUDAS
*Director of the United States Patent and Trademark Office*